United States Patent
Malba

[19]

[11] Patent Number: 5,834,162
[45] Date of Patent: Nov. 10, 1998

[54] PROCESS FOR 3D CHIP STACKING

[75] Inventor: Vincent Malba, Livermore, Calif.

[73] Assignee: Regents of the University of California, Oakland, Calif.

[21] Appl. No.: 739,082

[22] Filed: Oct. 28, 1996

[51] Int. Cl.$^6$ .............................. G03F 7/00; H01L 21/60
[52] U.S. Cl. .................. 430/317; 430/314; 430/945; 438/109; 438/612; 438/618; 438/666
[58] Field of Search ..................................... 430/314, 317, 430/945; 438/109, 110, 612, 618, 666, 611, 368, 427

[56] References Cited

U.S. PATENT DOCUMENTS

| | | | |
|---|---|---|---|
| 4,778,326 | 10/1988 | Atlhouse et al. | 414/786 |
| 5,107,586 | 4/1992 | Eichelberger et al. | 438/109 |
| 5,126,286 | 6/1992 | Chance | 438/666 |
| 5,571,754 | 11/1996 | Bertin et al. | 438/109 |
| 5,653,019 | 8/1997 | Bernhardt et al. | 438/618 |

*Primary Examiner*—Kathleen Duda
*Assistant Examiner*—John VanderWilt
*Attorney, Agent, or Firm*—L. E. Carnahan; Henry P. Sartorio

[57] ABSTRACT

A manufacturable process for fabricating electrical interconnects which extend from a top surface of an integrated circuit chip to a sidewall of the chip using laser pantography to pattern three dimensional interconnects. The electrical interconnects may be of an L-connect or L-shaped type. The process implements three dimensional (3D) stacking by moving the conventional bond or interface pads on a chip to the sidewall of the chip. Implementation of the process includes: 1) holding individual chips for batch processing, 2) depositing a dielectric passivation layer on the top and sidewalls of the chips, 3) opening vias in the dielectric, 4) forming the interconnects by laser pantography, and 5) removing the chips from the holding means. The process enables low cost manufacturing of chips with bond pads on the sidewalls, which enables stacking for increased performance, reduced space, and higher functional per unit volume.

17 Claims, 2 Drawing Sheets

PROCESS FOR 3D CHIP STACKING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to stacking of integrated circuit chips, particularly to the formation on bond pads on the sidewalls of the chips which enable ready access for interconnecting stacked chips or chip packages, and more particularly to a low cost manufacturing process for producing chips with bond pads on the sidewalls thereof by forming electrical interconnects with bonding pads on the top surface of the chips.

The memory density of integrated circuit memory chips has been increasing at a rapid rate over the past decade, and this need for increased density will continue in the near future for applications such as super computer memories. In addition, there is a demand for increased chip packaging density to increase performance, reduce space, and provide higher functionality per unit volume needed for applications such as space-based electronic systems, miniaturized electronics for weaponry and surveillance, and hand-held electronics systems. One solution to the demand for increased density is to package the chips closer together, so that the effective density per unit volume increases. The densest packaging of chips is to stack them one on top of another into a single three dimensional (3D) unit or cube. In order to stack chips on top of each other, the bond pads, normally located on a top surface of the chip, must be extended to the edge surface or sidewall of the chip, and must be exposed so that attachment to another level of the stacked chips for packaging is readily accessible.

The extending of the bond pads to the edge of the chip has been carried out in a number of ways. One of the more elegant, simple, and straightforward methods involves the implementation of L-connects, which are metal traces patterned with laser pantography from the top of the chip, over the edge, and onto the sidewall before the chips are stacked. This method is described and claimed in U.S. application Ser. No. 08/733,854, filed Oct. 18, 1996, entitled "L-Connect Routing Of Die Surface Pad To The Die Edge For Stacking In A 3D Array," assigned to the same assignee. With the input/output (I/O) pads routed onto the sidewall of the chip, they are available for ready attachment to any point of use, particularly for stacking of chips and packaging of stacked chips.

The present invention provides a manufacturing process which implements the 3D chip stacking using interconnects, such as "L-connect" of the above-referenced copending application, for extending the chip bond pads to a sidewall or sidewalls of the chip. The invention involves an improved process for forming the "L-connect" (electrical interconnect) which holds the chips during processing, utilizes a dielectric passivation layer on the top surface and sidewalls of the chips, forming opening vias through the passivation layer in the top and sidewalls in a desired pattern, and forming electrically conductive traces on the patterned vias using robust laser pantography.

SUMMARY OF THE INVENTION

It is an object of the present invention to provide a manufacturing process for producing integrated circuit chips capable of three dimensional stacking.

A further object of the invention is to provide a low cost manufacturing process for forming interconnects extending from a bond pad on a top surface of a chip to one or more sidewalls of the chip.

Another object of the invention is to provide an improved process for forming an "L-connect" on integrated circuit chips for enabling stacking of chips.

Another object of the invention is to provide a process which implements the 3-D chip stacking approach using an "L-connect" (interconnect) arrangement, which involves holding individual chips for batch processing, formation of a dielectric layer thereon, forming a desired pattern of vias in the dielectric, and forming the interconnects using laser pantography.

Other objects and advantages of the present invention will become apparent from the following description and accompanying drawings. The invention is primarily directed to an implementation of the "L-connect" concept of the above-referenced application Ser. No. 08/733,854, wherein L-connects (electrical interconnections) are patterned from the top surface of an integrated circuit chip or die to the sidewall of the chip using laser pantography. Implementation of the L-connect approach includes a process which involves holding individual chips for batch processing, depositing a dielectric passivation layer on the top and sidewalls of the chip, opening patterned vias in the dielectric, forming the L-connects using laser pantography, and removing the chips from the holding package. The improved process of this invention provides low cost manufacture of the chip configured to enable stacking of the chips for increased performance, reduced space, and higher functionality per unit volume, for applications such as super computers, space-based and hand-held electronic systems, and miniaturized electronics for weaponry and surveillance.

BRIEF DESCRIPTION OF THE DRAWINGS

The accompanying drawings, which are incorporated into and form a part of the disclosure illustrate an embodiment of the invention and, together with the description, serve to explain the principles of the invention.

DETAILED DESCRIPTION OF THE INVENTION

Figure 1:
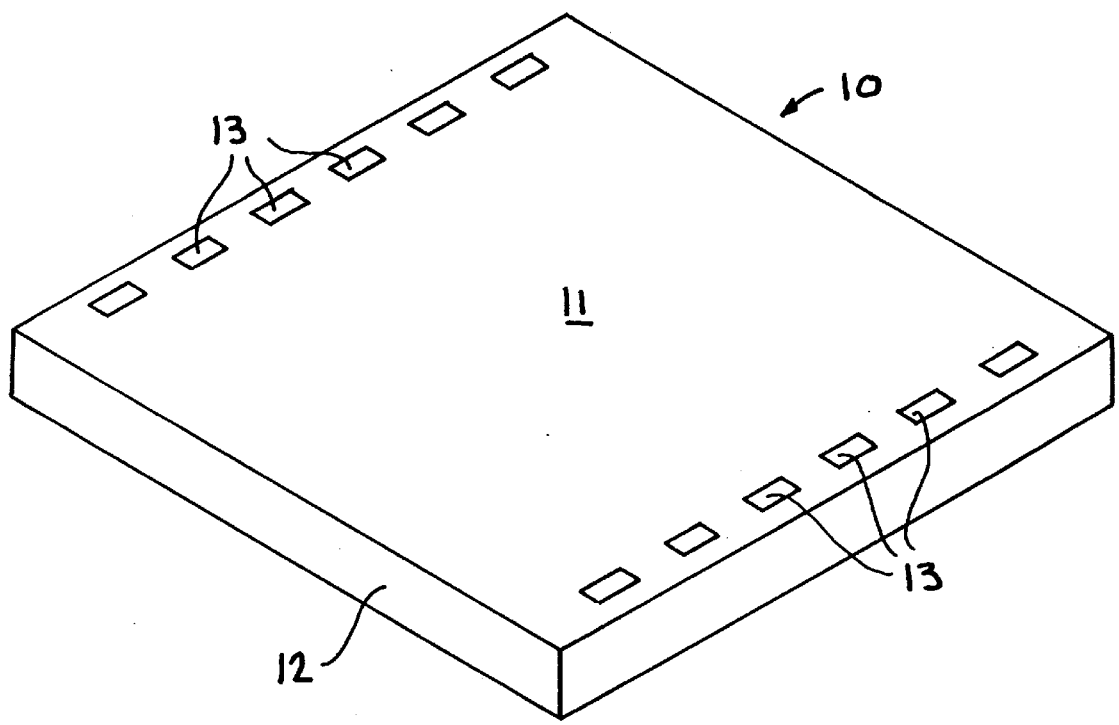
FIG. 1 is a perspective view of a conventional integrated circuit chip or die.

The present invention is directed to a manufacturable process which implements 3-D chip stacking using interconnects, such as the L-connects of above-referenced copending application Ser. No. 08/733,854. L-connects are metal traces patterned with laser pantography from the top surface of a chip or die, over the edge of the chips, and onto a sidewall before the chips are stacked, thereby extending the bond pads normally located on the top surface of the chip to the sidewall of the chip. With the I/O pads routed onto the sidewall, they are readily available for attachment to a desired location. Implementation of the L-connect top surface to sidewall approach requires:

1. Placing the chips or die in a temporary handling arrangement for holding individual chips securely in an efficient, damage-free manner, during handling, processing, and patterning, and facilitate batch processing of chips after they have been cut from an original silicon wafer into individual chips.

2. Depositing a dielectric passivation layer on both the top surface and sidewalls of the chips.

3. Opening vias through the dielectric layer on the top and one or more sidewalls of the chip, in order to electrically connect to the bond pads on the top of the chip, which are to be routed over the dielectric layer to the sidewalls to form the L-connects.

4. By laser pantography, forming the metal traces from the top surface of the chip to the sidewalls.

5. Removing the chips from the temporary handling arrangement.

Methods for handling individual chips for processing are known in the art. Two such methods are described by way of example. The first of these methods uses a hold-and-release method developed by Victor Athouse, Gel-Pak, Inc., as described in U.S. Pat. Nos. 4,667,944 issued May 26, 1987; No. 4,711,014 issued Dec. 8, 1987, and 4,778,326 issued Oct. 18, 1988. In this method a silicone polymer sheet is stretched over a mesh or screen. Chips can be attached to the silicone because the silicone has sufficient tack to hold chips that are lightly pressed onto it. To remove the chips, a vacuum is pulled through the mesh, which is on the other side of the silicone from the chips, which causes the silicone to be drawn into the mesh, decreasing the surface area of silicone on the back of the chips. The chips can easily be removed with a vacuum wand or tweezers. The silicone has been shown to be compatible with subsequent processing. The second method for holding the chips involves the adhesion of the chips onto a temporary substrate using small amounts of adhesive to hold the chips in place. The adhesive must be capable of withstanding the subsequent processing required by laser pantography. A pick-and-place or a template can be used to position the chips accurately with respect to each other (the adhesive should be thermoplastic enough to soften at elevated temperatures to facilitate removal of the chips). Alternatively, the adhesive can be dissolved away to remove the chips. The first method has the advantage of fewer steps with less post process cleaning required.

Vapor deposition polymerization (VDP) of polyimide is an effective and efficient method for producing a dielectric passivation film on both the top and sidewalls of the chips. The polyimide is deposited in a vacuum chamber followed by a short curing step. This operation is described in greater detail hereinafter.

Other methods of forming the dielectric passivation film, such as PECVD of silicon oxide or silicon nitride or silicon oxy-nitride, polyamide and parlyene, or RIE etching, are available; but the VDP polyimide method has the fewest steps with the highest yield potential, which translates into a manufacturable process.

The vias can be opened in the VDP polyimide with a single step laser ablation using a pulsed or CW ultraviolet (UV) laser, as described hereinafter.

The metal traces or L-connects are then formed on the top and sidewall of the chip by laser pantography for patterning in three (3) dimensions the desired interconnects. This can be accomplished using the steps outlined in copending application Ser. No. 08/387,495, filed Feb. 13, 1995, entitled "3-D Laser Patterning Process," assigned to the same assignee, and described in greater detail hereinafter. Laser pantography may be carried out using a continuous wave (CW) laser, such as an argon-ion laser, or using a pulsed laser, such as an Nd:YAG, excimer, and nitrogen laser.

Referring now to the drawings, FIG. 1 illustrates a conventional integrated circuit chip 10 having a top surface 11 and sidewalls 12, with a plurality of bond pads 13 on the top surface 11.

Figure 2:
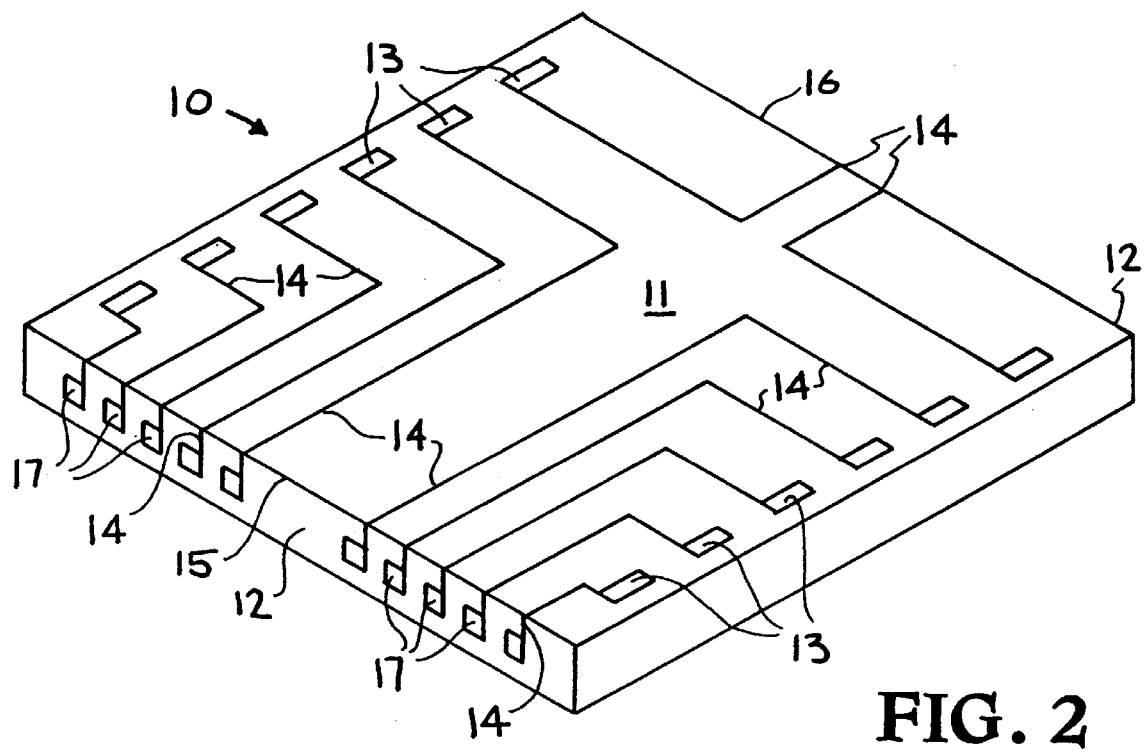
FIG. 2 is a perspective view of the chip of FIG. 1 with L-connects formed thereon in accordance with the invention.

FIG. 2 illustrates an embodiment of a chip 10 processed in accordance with the invention in which L-connects 14 extend from the bond pads 13 across the top surface 11, over the edges 15 and/or 16, to the sidewalls 12. Bond pads 17 are formed on the sidewalls 12 in contact with the L-connects 14, and may be formed integral with the L-connects 14 or separately, or the bond pads can be omitted. While FIG. 2 illustrates the L-connects 14 extending over edges 15 and 16 onto opposite sidewalls of the chip 10, as a current general practice the L-connects would extend onto one sidewall only; but in the future several chip sides may be patterned.

Figure 3:
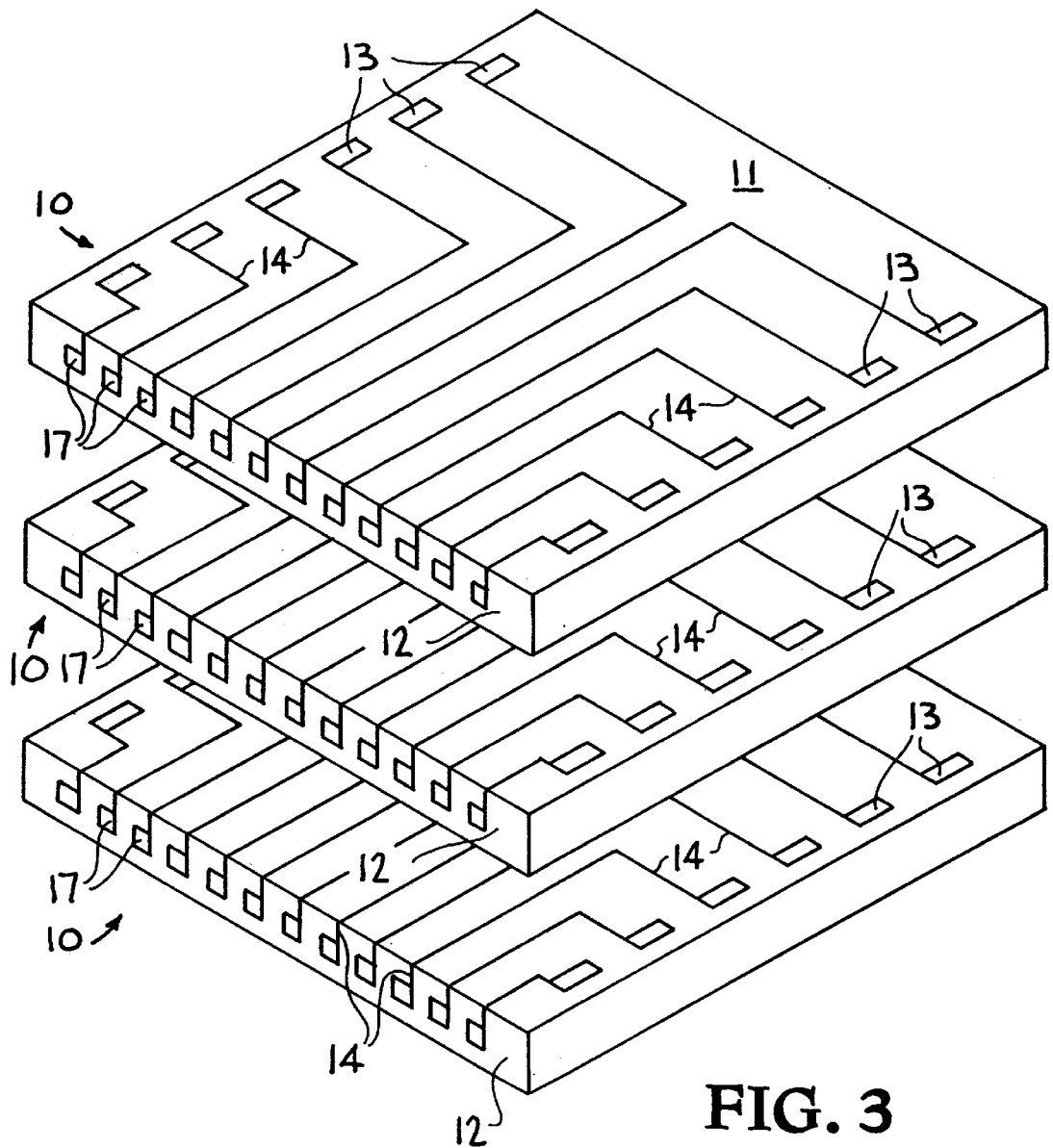
FIG. 3 is a perspective exploded view of stacked integrated circuit chips, each made in accordance with the invention.

FIG. 3 illustrates an exploded stack of chips 10 having L-connects 14 extending from bond pads 13 to only one sidewall 12, with bond pads 17 formed thereon. It is readily seen that when the chips 10 of FIG. 3 are stacked one on top of another electrical interconnects between the sidewall bond pads 17, or the interconnect portions on the sidewalls if bond pads are omitted, of the various chips can be easily made. Also, with the chips stacked, packaging of the stacked chips with other chips or desired component can be readily accomplished due to the sidewall bond pads 17.

The following sets forth a specific operational sequence for forming the L-connects and sidewall bond pads on integrated circuit chips:

1. Holding for processing, a plurality of chips having bond pads on the top surfaces thereof, by:

Chips are adhered to a substrate (typically a 4" silicon wafer) with very small amounts of a 2-part 30 minute open time epoxy adhesive. The chips are placed in the slots of a template to insure adequate alignment.

Alternately, the chips are placed onto a Gel-Pak carrier, the case of which is made of aluminum in place of the normally-used plastic. A pick and place can be used to control the alignment.

Alignment is not a critical issue because the Laser Pantography apparatus can compensate. However, the better the alignment, the faster the process.

2. Forming a dielectric passivation film or layer on the top surface and sidewalls of the chip by:

The Si substrate with attached chips is mounted on a rotating planetary which is upside down in a vacuum evaporator system which has been modified to deposit co-polymers from monomer sources. The baseline pressure is in the 10(−6) range, while the operating pressure is in the low 10(−5) range. The "gun," or source, consists of two thermally separated chambers each of which contains one monomer. These chambers are individually heated, resulting in sublimation of the monomers. The rate of effusion from the chambers is monitored with Inficon crystals. The monomers escape from the chambers through a small opening in each which is directed up toward the planetary.

Pyromellitic dianhydride (PMDA) is co-deposited with 4,4"-oxydianiline (ODA) to produce a film (PMDA/ODA) which is chemically identical to Kapton. Other monomer combinations are also possible, such as 3,3', 4,4'-biphenyl tetracarboxylic dianhidride (BPDA) and p-phenylene diamine (PPD).

PMDA/ODA is deposited at a rate of 2–3 microns an hour. Typically, 1–2 microns are deposited. The individual monomers are heated to 100°–150° C. The substrate is not heated.

The deposited polymer film must be cured to form polyimide. The substrate is placed in an oven at 120° C. for 15 minutes. The temperature is then ramped to 260°–400° C. for one hour.

3. Opening vias in the dielectric film by:

An argon-ion CW laser operating in the multiline UV at 3–4 Watts power can be used to open the vias. A power of 300 milliwatts focused into a 40 micron by 5 micron beam is sufficient to remove a 1 micron thick polyimide film.

Alternately, a pulsed Nd:YAG laser quadrupled to produce the 254 nm line can be used to open almost any thickness of polyimide.

Alternately, an excimer laser could also be used. Any UV wavelength would be appropriate.

A short ashing step (oxygen plasma for 10 minutes at 150 Watts) is useful for cleaning any debris left in the vias.

4. Forming the L-connects or metal traces by:

A seed layer consisting of a titanium layer (500–1000Å thick) followed by a copper layer (2000–6000Å thick) is sputtered onto the part (i.e., substrate with dice attached). A positive electrodeposited photoresist (Shipley's PEPR 2400) is plated onto the part (5–10 microns). A CW argon-ion laser focused to a 40 micron by 5 micron beam is used to expose the pattern on the chip. To pattern the sidewalls, the beam is sent through an objective at an angle to the substrate. The resist is developed in 1% potassium carbonate. Copper (3–7 microns) is plated through the resist mask. The remaining resist is stripped with hot base. The copper seed is removed with ammonium persulfate, and the titanium adhesion layer is removed with SF6 in an RIE reactor.

5. Removing the processed chips from the holding arrangement by:

The chips are removed from the Si substrate by heating the substrate to 100°–200° C. for a few minutes on a hot plate, and gently pushing off the chips.

The chips are removed from the Gel-Pak by applying a vacuum to the package, which causes the silicone film to be drawn partially through the mesh, reducing the surface area of the silicone to chip interface, allowing the chips to be removed easily with a vacuum wand.

It has thus been shown that the present invention provides an implementation method by which chips having L-connects for stacking can be fabricated in a batch process. While the process has been described relative to the formation of L-connects (L-shaped electrical interconnects) the process can be utilized using any desired interconnect configuration or combination of interconnect configurations, whereby bond pads on a top surface of a chip are extended to an edge or sidewall of the chip. Also, by this process top surface bond pads can be extended to one or more of the chip sidewalls which enables stacking of the chips, interconnection of the chip to other components, and/or packaging of stacked chips to other stacked chips or components.

While particular embodiments, a specific operational sequence, materials, parameters, laser parameters, etc., have been described and/or illustrated to exemplify and set forth the principles of the invention, such are not intended to be limiting. Modifications and changes may become apparent to those skilled in the art, and it is intended that the invention by limited only by the scope of the appended claims.

The invention claimed is:

1. A method for extending bond pads on a top surface of an integrated circuit chip to a sidewall of the chip, comprising:

temporarily holding a plurality of chips for processing, forming a dielectric layer on the top surface and at least one sidewall of the chips, opening vias in the dielectric layer on the top surface and the at least one sidewall of each chip, forming patterned metal traces connected to the bond pads on the top surface and extending only onto the at least one sidewall of each chip using laser pantography, and removing the thus processed chips from the temporary holding arrangement.

2. The method of claim 1, wherein temporarily holding the chips is carried out by placing the bottom surface of the chips on a silicone layer which is supported on a mesh material, and wherein removing the chips is carried out by drawing a vacuum through the mesh material for reducing contact between the chips and the silicone layer, and removing the chips from the silicone layer.

3. The method of claim 1, wherein temporarily holding the chips is carried out by positioning the chips on a substrate via an adhesive material and wherein removing the chips is carried out by processing the adhesive material to reduce adhesion to the chips, and removing the chip therefrom.

4. The method of claim 1, wherein forming the dielectric layer is carried out by vapor deposition polymerization of polyimide, and curing the polyimide.

5. The method of claim 1, wherein forming the dielectric layer is carried out by vapor deposition polymerization, PECVD, or RIE etching.

6. The method of claim 1, wherein the vias are opened in the dielectric layer by laser ablation.

7. The method of claim 1, wherein laser pantography is carried out using a laser selected from the group consisting of argon-ion, Nd:YAG, excimer, and nitrogen.

8. The method of claim 1, wherein laser pantography is carried out using a pulsed laser.

9. The method of claim 1, wherein the vias are opened using an ultraviolet laser selected from the group consisting of pulsed and continuous wave lasers.

10. The method of claim 1, wherein the dielectric layer is formed of material selected from the group consisting of polyimide, silicon oxide, silicon nitride, silicon oxy-nitride, polyamide, and parlyene.

11. The method of claim 1, wherein the patterned metal traces are patterned in an L-shaped configuration.

12. The method of claim 1, additionally including forming bond pads on the sidewalls of the chips, and interconnecting bond pads on the top surface of the chips with the bond pads of the sidewalls with L-connects composed of the metal traces.

13. A process for three dimensional chip stacking, including:

providing a plurality of chips having bond pads on a surface thereof, and forming L-connects on the surface and one or more sidewalls of the chips which are in electrical contact with the bond pads, forming of the L-connects by providing the chips with a dielectric film on the surface and one or more sidewalls, forming vias in the dielectric film, and directing laser energy onto the dielectric film forming patterned metal traces, and stacking the chips one on top of another whereby the chips can be interconnected via the L-connects on the one or more sidewalls.

14. The process of claim 13, additionally including releasably holding the plurality of chips to enable forming the L-connects in a batch process.

15. The process of claim 13, wherein releasably holding the plurality of chips involves positioning a surface of the chips on a material selected from the group of silicone and adhesive.

16. The process of claim 13, additionally including forming bond pads on the chip sidewalls in contact with the L-connects.

17. The process of claim 13, wherein the laser energy directed onto the dielectric film is carried out using laser pantography.

* * * * *